United States Patent
Saijo et al.

(10) Patent No.: US 6,949,412 B2
(45) Date of Patent: *Sep. 27, 2005

(54) CLAD PLATE FOR FORMING INTERPOSER FOR SEMICONDUCTOR DEVICE, INTERPOSER FOR SEMICONDUCTOR DEVICE, AND METHOD OF MANUFACTURING THEM

(75) Inventors: Kinji Saijo, Yamaguchi-ken (JP); Kazuo Yoshida, Yamaguchi-ken (JP); Hiroaki Okamoto, Yamaguchi-ken (JP); Shinji Ohsawa, Yamaguchi-ken (JP)

(73) Assignee: Toyo Kohan Co., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/410,256

(22) Filed: Apr. 10, 2003

(65) Prior Publication Data

US 2003/0186484 A1 Oct. 2, 2003

Related U.S. Application Data

(63) Continuation of application No. 10/009,196, filed on Apr. 15, 2002, now Pat. No. 6,838,318.

(30) Foreign Application Priority Data

Jun. 10, 1999 (JP) ............................................ 11-164454

(51) Int. Cl.⁷ ........................ H01L 21/50; B21D 33/00; H01S 4/00
(52) U.S. Cl. ........................ 438/121; 29/17.2; 29/17.3; 29/592.1
(58) Field of Search ................................ 428/209, 675, 428/678, 680; 29/17.1, 17.2, 17.3, 592.1, 825; 438/121

(56) References Cited

U.S. PATENT DOCUMENTS

| | | | |
|---|---|---|---|
| 5,426,850 A | * | 6/1995 | Fukutomi et al. ............. 29/848 |
| 5,482,784 A | | 1/1996 | Ohara et al. |
| 5,683,942 A | | 11/1997 | Kata et al. |
| 5,736,234 A | | 4/1998 | Mizunashi |
| 5,905,303 A | | 5/1999 | Kata et al. |
| 6,032,362 A | | 3/2000 | Okikawa et al. |
| 6,150,037 A | | 11/2000 | Saijo et al. |

OTHER PUBLICATIONS

Abstract of JP, 2000–188455 published, Jul. 4, 2000.
Abstract of JP, 1–224184, published Sep. 7, 1989.
Patent Abstract DialogIP of "JP 10074807 A, published Mar. 17, 1998, entitled Flexible Film and Semiconductor Device Having it, applicant NEC Corp".

* cited by examiner

*Primary Examiner*—Michael Lebentritt
*Assistant Examiner*—Scott B. Geyer
(74) *Attorney, Agent, or Firm*—Browdy and Neimark, P.L.L.C.

(57) ABSTRACT

A clad plate for forming an interposer for a semiconductor device which can be manufactured at low cost and has good characteristics, an interposer for a semiconductor device, and a method of manufacturing them. Copper foil materials (19, 24, 33) forming conductive layers (10, 17, 18) and nickel plating (20, 21) forming etching stopper layers (11, 12) are formed and pressed to form a clad plate (34) for forming an interposer for a semiconductor device. Thus, a clad plate (34) for forming an interposer for a semiconductor device is manufactured. The clad plate (34) is selectively etched to form a columnar conductor (17), and an insulating layer (13) is formed on the copper foil material forming a wiring layer (10). A bump (18) for connection of a semiconductor chip and the wiring layer (10) are formed on the opposite side to the side on which the columnar conductor (17) is formed. Thus, an interposer for a semiconductor device is manufactured.

2 Claims, 5 Drawing Sheets

CLAD PLATE FOR FORMING INTERPOSER FOR SEMICONDUCTOR DEVICE, INTERPOSER FOR SEMICONDUCTOR DEVICE, AND METHOD OF MANUFACTURING THEM

RELATED APPLICATIONS

The present application is a continuation application of application Ser. No. 10/009,196, filed Apr. 15, 2002 now U.S. Pat. No. 6,838,318 nationalized Dec. 10, 2001, which is the national stage under 35 U.S.C. §371 of international application PCT/JP00/03746, filed Jun. 9, 2000, which designated the United States, and which application was not published in the English language.

TECHNICAL FIELD

This invention concerns an interposer-forming clad plate for use in a semiconductor device which is a substrate to mount semiconductor chips, an interposer for use in a semiconductor device to be manufactured by using the clad material, as well as a manufacturing method of them.

BACKGROUND OF THE INVENTION

In recent years, along with reduction of size and weight and enhancement for the function of electronic equipments, size reduction has been required also for semiconductor packaging devices mounted therein and small-sized package devices have been developed. Then, a semiconductor device of a size substantially equal with the chip size has been proposed. Japanese Patent Laid-Open No. 74807/1998 discloses a method of manufacturing such a semiconductor device and a schematic view thereof is shown in FIG. 12. A semiconductor chip 101 is mounted on one side of an interposer 100 (substrate) and connected with a wiring pattern 102 on the substrate. Further, the wirings are conducted through via holes 103 formed in the direction of the thickness of the substrate to a mounting substrate, and solder bumps 104 for external connection are formed to the via holes on the side of the mounting substrate.

In the semiconductor device of the constitution as described above, conduction between both surfaces of the interposer is taken by forming through holes and then filling a conductive material, for example, by plating. However, steps of forming fine through holes and applying plating therein results in a technical difficulty and it requires to apply a relatively thick plating to bring about a problem of increasing the cost.

This invention intends to solve the subject described above and it is a subject thereof to provide an interposer-forming clad plate for use in a semiconductor device capable of being manufactured at a reduced cost and having favorable characteristics, an interposer for use in a semiconductor device using the same and a manufacturing method of them.

DISCLOSURE OF THE INVENTION

An interposer-forming clad plate for use in a semiconductor device according to this invention has a feature that it is manufactured by press-bonding a copper foil material and a nickel foil material at a rolling reduction of 0.1 to 3%.

A clad plate according to this invention has a feature that it is manufactured by press-bonding a copper foil material having nickel plating on one or both surfaces and another copper foil material or a copper foil material having a nickel plating on one surface at a rolling reduction of 0.1 to 3%.

Another feature of the clad plate according to this invention resides in that it consists of five layers of copper/nickel/copper/nickel/copper.

The interposer for use in the semiconductor device according to this invention is characterized in that one of the clad plates described above is selectively etched to form connection bumps with a semiconductor chip and wiring layers, the semiconductor chip and the wiring layer are connected through the semiconductor chip connection bumps by using anisotropically conductive adhesives and conduction in the direction of the thickness of the interposer is taken by way of a columnar conductor formed by etching.

A method of manufacturing an interposer for use in a semiconductor device according to this invention is characterized by laminating a copper foil material forming a conductor layer or the like, a nickel foil material or nickel plating forming an etching stop layer and press-bonding them at a rolling reduction of 0.1 to 3% to form a clad plate for forming an interposer for use in a semiconductor device, selectively etching the clad plate to form a columnar conductor, forming an insulation layer on a copper foil material forming a wiring layer, and forming semiconductor chip connection bumps and a wiring layer to the clad plate on the side opposite to the columnar conductor forming surface.

A method of manufacturing a clad plate according to this invention is characterized by forming a clad plate by previously applying an activating treatment to a bonding surface of a copper foil and a nickel foil or nickel plating in a vacuum vessel, then laminating the copper foil and, the nickel foil or the nickel plating and cold press-bonding them a 0.1 to 3% rolling reduction in which the activating treatment is conducted <1> in an inert gas atmosphere at an extremely low pressure of $1 \times 10^1$ to $1 \times 10^{-2}$ Pa, <2> using the nickel plated copper foil material and the copper foil material as one electrode A having the bonding surfaces grounded to the earth, respectively, and conducting glow discharge by applying an AC current at 1 to 50 MHz between it and the other electrode B supported insulatively and <4> applying sputter etching, <3> with the area of the electrode exposed in plasmas caused by the glow discharge being ⅓ or less of the electrode B.

BEST MODE FOR CARRYING OUT THE INVENTION

Figure 1:
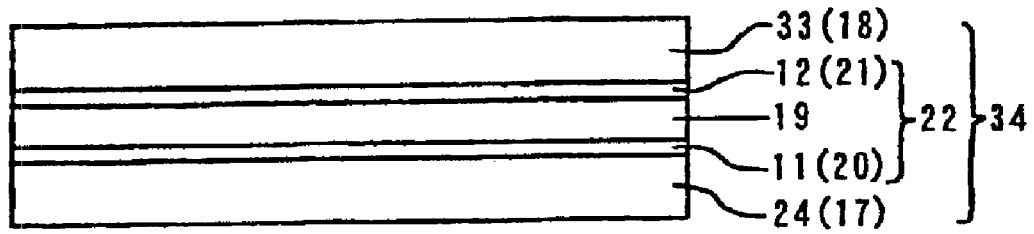
FIG. 1 is an explanatory view for the steps in a method of manufacturing an interposer for use in a semiconductor device according to one embodiment of this invention.

This invention is to be explained concretely with reference to one embodiment shown in FIG. 1 to FIG. 10. At first, the structure of a semiconductor device according to one embodiment of this invention is to be explained with reference to FIG. 10.

As illustrated, etching stopper layers 11 and 12 (suitably with a thickness of 0.1 to 3 mm) are bonded on both surfaces of a wiring layer 10 comprising a copper foil (suitably with a thickness of 10 to 100 mm). A connection bump 18 (suitably with a thickness of 10 to 100 mm) for a semiconductor chip is formed at the top end of the wiring layer 10 on the side of mounting the semiconductor chip 1. Further, an insulative resin 13 is formed to the wiring layer on the side of the mounting substrate and conducted with the mounting surface is taken by way of a columnar conductor 17 (suitably with a thickness of 10 to 100 mm) and solder bumps 2 are formed on the mounting surface.

Then, explanation is to be made to a method of manufacturing an interposer for use in a semiconductor device described above. At first, nickel plating 20 and 21 as etching stopper layers 11 and 12 are applied on both surfaces of a copper foil 19 (suitably with a thickness of 10 to 100 mm) to form an internal conductor layer 10 upon manufacturing the interposer for use in the semiconductor device to manufacture a nickel plated copper foil material 22 (refer to FIG. 1).

Figure 11:
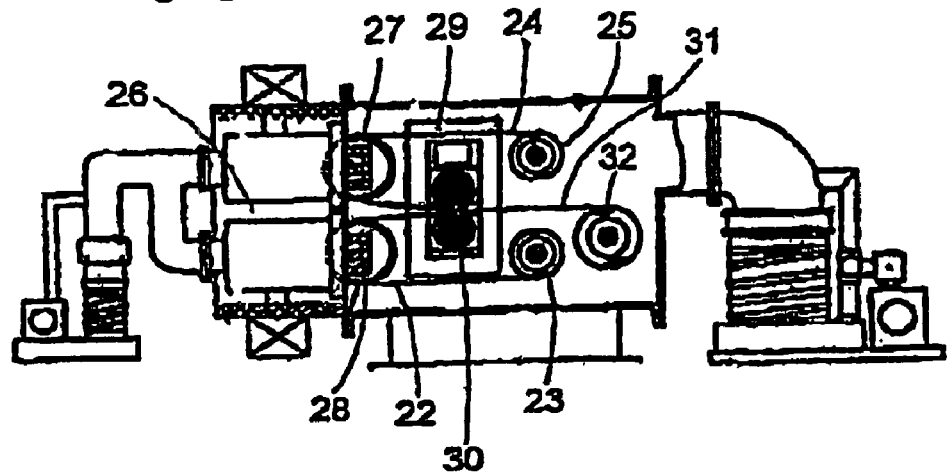
FIG. 11 is a cross sectional front elevational view of an apparatus for manufacturing the clad plate.
Figure 12:
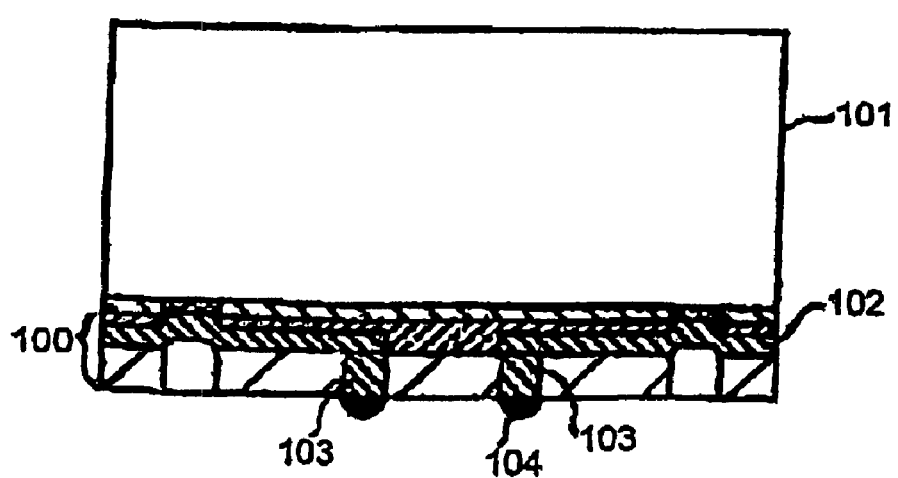
FIG. 12 is a cross sectional view of an existent interposer for use in a semiconductor device.

Then, the nickel-plated copper foil material 22 is wound around a delivery reel 23 in a clad plate manufacturing apparatus shown in FIG. 11. Further, a copper foil material 24 as a columnar contactor 17 is wound around a delivery reel 25. The nickel-plated copper foil material 22 and the copper foil material 24 are delivered simultaneously from the delivery reels 23 and 25 and a portion thereof is wound around electrode rolls 27 and 28 protruded in an etching chamber 26 and sputter etching is applied to activate in the etching chamber 26.

In the case, the activating treatment is applied as disclosed previously by the present applicant in Japanese Patent Laid-Open No. No. 224184/1989 <1> in an inert gas atmosphere at an extremely low pressure of $1\times10^1$ to $1\times10^{-2}$ Pa, <2> using the nickel plated copper foil material 22 and the copper foil material 24 as one electrode A having the bonding surfaces grounded to the earth, respectively, and conducting glow discharge by applying an AC current at 1 to 50 MHz between it and the other electrode B supported insulatively and <4> applying sputter etching, <3> with the area of the electrode exposed in plasmas caused by the glow discharge being ⅓ or less of the electrode B.

Subsequently, they are cold press-bonded by a rolling unit 30 disposed in the vacuum vessel 29 and an interposer-forming clad plate 31 having a three layered structure for use in a semiconductor device is wound around a delivery roll 32.

Then, the interposer-forming clad plate 31 for use in the semiconductor device having the three layered structure is again wound around the delivery roll 23. Further, a copper foil 33 (refer to FIG. 1) as a connection bump 18 is wound around the delivery reel 25. The clad plate 31 and the copper foil material 33 are unwound from the delivery reels 23 and 25 and a portion thereof is wound around the electrode rolls 27 and 28 protruded in the etching chamber 26 and applied with and activated by sputter etching treatment in the etching chamber 26.

Also in this case, the activating treatment is applied <1> in an inert gas atmosphere at an extremely low pressure of $1\times10^1$ to $1\times10^{-2}$ Pa, <2> using the nickel plated copper foil material 22 and the copper foil material 24 as one electrode A having the bonding surfaces grounded to the earth, respectively, and conducting glow discharge by applying an AC current at 1 to 50 MHz between it and other electrode B supported insulatively and <4> applying sputter etching, <3> with the area of the electrode exposed in plasmas caused by the glow discharge being ⅓ or less of the electrode B to manufacture a clad plate 34 for use in the semiconductor device having a five layered structure.

In the foregoings, explanation has been made to an example of press-bonding a material formed by previously nickel plating on a copper foil material, a material formed by press-bonding a nickel foil to a copper foil material by using the apparatus described above may also be used instead of the nickel plating.

Further, by repeating the press-bonding using the apparatus described above, a multi-layered clad layer can be manufactured in which a copper layer is disposed to the surface and the rearface layers and the nickel layer is interposed as the intermediate layer in the order of copper/nickel/copper/nickel/copper.

Further, when three or more sets of delivery reels are disposed, copper foil material or nickel foil material are disposed to the reels and foil materials are simultaneously supplied from the three or more reels, a clad plate of a multi-layered structure can be manufactured by press-bonding only once.

Figure 2:
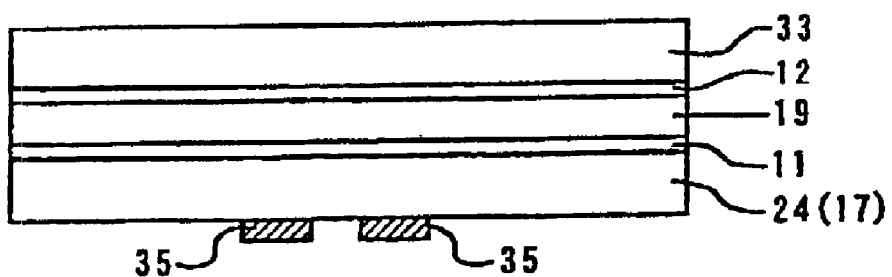
FIG. 2 is an explanatory view for the steps in a method of manufacturing an interposer for use in a semiconductor device according to one embodiment of this invention.

After cutting the interposer-forming clad plate 34 for use in the semiconductor device into a desired size, an interposer for use in the semiconductor is manufactured by way of the following steps to be explained with reference to FIG. 2 to FIG. 9. At first, as shown in FIG. 2, after forming a photoresist film 35 on the surface of the copper foil 24, it is exposed and developed.

Figure 3:
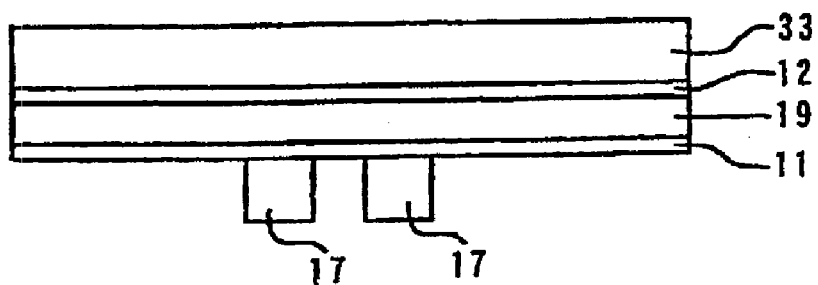
FIG. 3 is an explanatory view for the steps in a method of manufacturing an interposer for use in a semiconductor device according to one embodiment of this invention.

Then, as shown in FIG. 3, the copper foil material 24 is etched selectively and the copper foil 24 is removed leaving a columnar conductor 17. As an etching solution, sulfuric acid+ aqueous hydrogen peroxide or ammonium persulfate liquid is used preferably.

Figure 4:
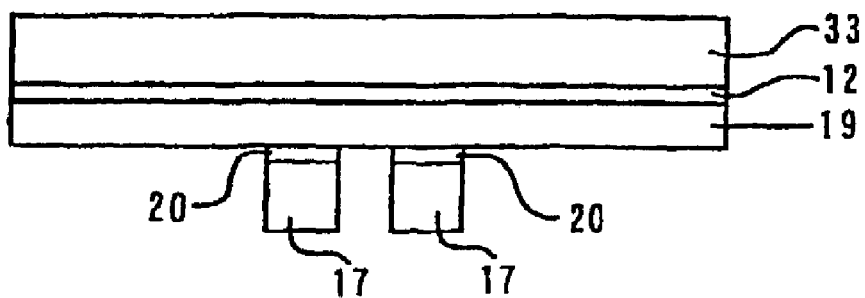
FIG. 4 is an explanatory view for the steps in a method of manufacturing an interposer for use in a semiconductor device according to one embodiment of this invention.

Then, as shown in FIG. 4, the nickel layer 20 is removed by selective etching. As the etching liquid, it is desirable to use a commercially available Ni etching liquid (for example, Merstrip N-950, manufactured by Mertechs Co.) is used preferably.

Figure 5:
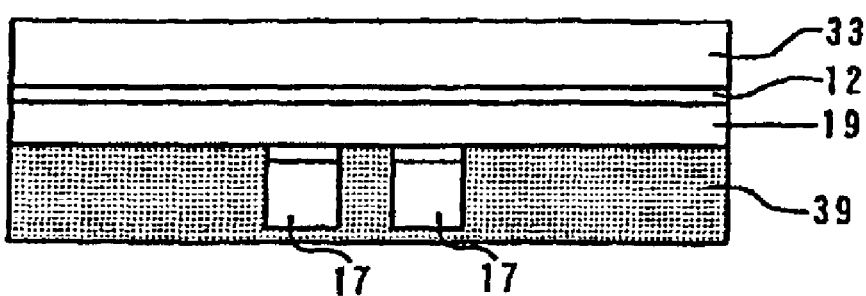
FIG. 5 is an explanatory view for the steps in a method of manufacturing an interposer for use in a semiconductor device according to one embodiment of this invention.

Then, as shown in FIG. 5, an insulative resin 39 is coated. As the insulative resin 39, use of an epoxy or polyimide resin is desirable.

Figure 6:
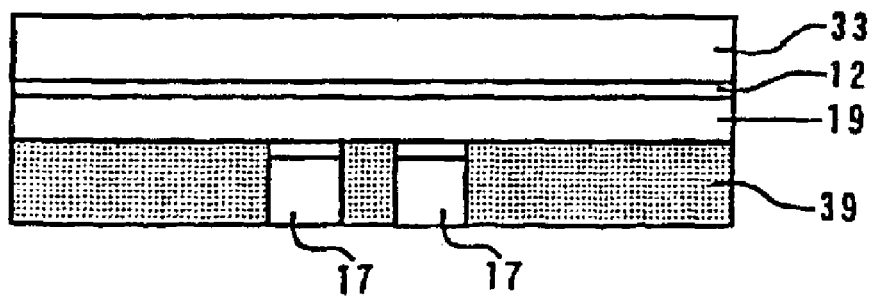
FIG. 6 is an explanatory view for the steps in a method of manufacturing an interposer for use in a semiconductor device according to one embodiment of this invention.

Then, as shown in FIG. 6, polishing is applied to make the surface of the resin 39 uniform. In this case, the head of the columnar conductor 17 is exposed to the surface. Instead of the polishing, it is possible to chemically remove the resin on the columnar conductor to exposer the head.

Figure 7:
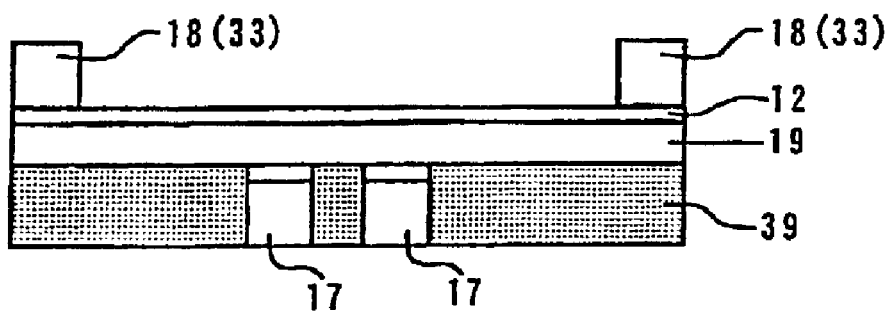
FIG. 7 is an explanatory view for the steps in a method of manufacturing an interposer for use in a semiconductor device according to one embodiment of this invention.

Further, as shown in FIG. 7, the copper foil material 33 is etched selectively to remove the copper foil material 33 leaving the columnar conductor 18. As the etching liquid, it is preferred to use, for example, sulfuric acid+ aqueous hydrogen peroxide or ammonium persulfate liquid.

Figure 8:
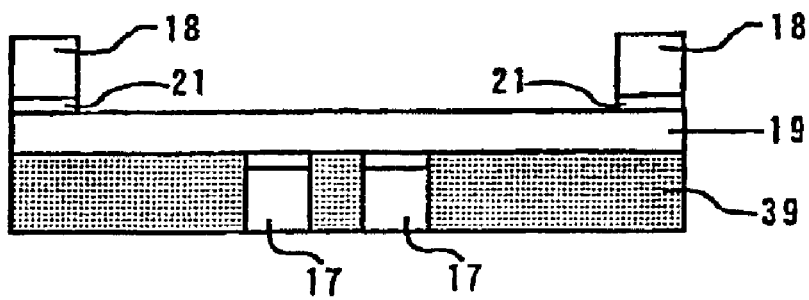
FIG. 8 is an explanatory view for the steps in a method of manufacturing an interposer for use in a semiconductor device according to one embodiment of this invention.

Then, as shown in FIG. 8, the nickel layer 21 is removed. As the etching liquid, it is preferred to use a commercially available Ni etching liquid (for example Merstrip N-950, manufactured by Mertechs Co.).

Figure 9:
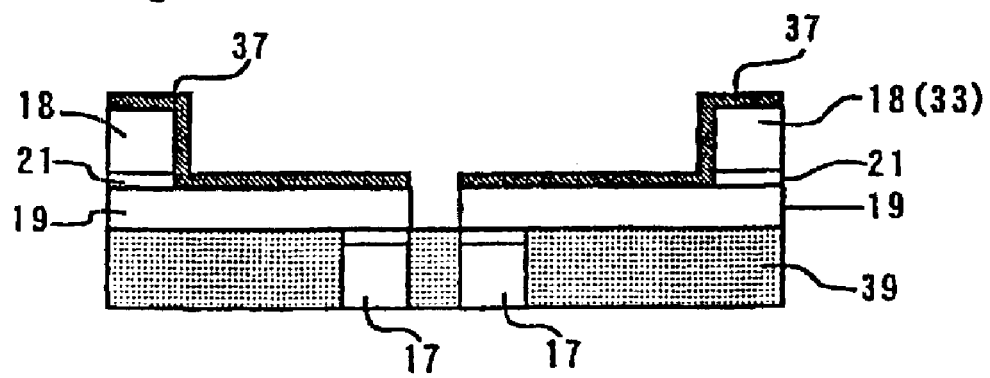
FIG. 9 is an explanatory view for the steps in a method of manufacturing an interposer for use in a semiconductor device according to one embodiment of this invention.

Then, as shown in FIG. 9, a photoresist film 37 is formed on the surface of the copper foil material and exposed and developed to etch the copper foil 19 by using, for example, ferric chloride or sulfuric acid+ aqueous hydrogen peroxide. Thus the wiring layer is formed.

Figure 10:
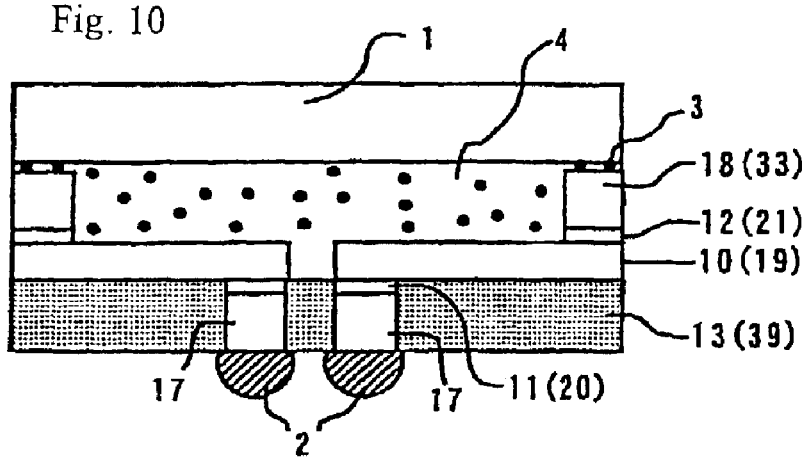
FIG. 10 is an explanatory view for the steps in a method of manufacturing an interposer for use in a semiconductor device according to one embodiment of this invention.

As shown in FIG. 10, a semiconductor chip 1 is connected to the surface of a wiring layer by use of anisotropically conductive adhesives 4 containing conductive particles 3. Further, a solder bump 2 is formed at a position corresponding to the columnar conductor 17 on the side of the mounting substrate.

INDUSTRIAL APPLICABILITY

As has been explained above, in the interposer-forming clad plate for use in the semiconductor device according to this invention, the copper foil material and the nickel foil material are press-bonded under a low rolling reduction of 0.1 to 3%, or the copper foil material having a nickel plating on one or both surfaces and other copper foil material or other copper foil material having a nickel plating on one or both surfaces in a laminated state are press-bonded at a low rolling reduction of 0.1 to 3%. Accordingly, the planarity at the bonding boundary can be maintained by suppressing the stress at the bonding boundary, and no alloyed metal is formed at the boundary since heat treatment for restoration of workability is no more necessary, it is possible to manufacture the interposer-forming clad plate for use in the semiconductor device of excellent selective etching property.

In the interposer for use in the semiconductor device according to this invention, since the interposer-forming clad plate for use in the semiconductor device as described above is etched selectively, to form connection bumps with semiconductor chip and the wiring layer and conduction of the interposer along the direction of the thickness is taken by way of the columnar conductor formed by etching, the interposer for use in the semiconductor device capable of coping with the small sized semiconductor device can be manufactured efficiently at a reduced cost. Further, since connection between the semiconductor chip and the wiring layer is conducted through the semiconductor chip connection bumps by using anisotropically conductive adhesives containing conductive particles, there is no requirement for forming the bump on the semiconductor chip and the cost for the semiconductor device can be reduced.

In the method of manufacturing the interposer for use in the semiconductor device according to this invention, since the copper foil to form the conductor layer and the nickel plating to form the etching stopper layer are laminated and press-bonded to form the clad plate for use in the semiconductor device, the clad plate is etched selectively to form the columnar conductor, the insulation layer is formed on the copper foil material forming the wiring layer, and the bump and the wiring layer for connecting the semiconductor chip are formed to the clad plate on the side opposite to the columnar conductor forming surface, thereby manufacturing the interposer for use in the semiconductor device, the interposer for use in the semiconductor device capable of coping with a small sized semiconductor device can be manufactured efficiently and at a reduced cost.

In the method of manufacturing the interposer-forming clad plate for use in the semiconductor device according to this invention, since the clad plate is formed by previously applying the activating treatment to the bonded surfaces of the copper foil and the nickel plating in the vacuum vessel, then laminating the copper foil and the nickel plating and cold press-bonding them at a rolling reduction of 0.1 to 3% in a vacuum vessel, the planarity at the bonded boundary can be maintained by suppressing the stress at the bonding boundary, and since the heat treatment for the restoration of the workability is no more required and no alloy layer is formed at the boundary, the interposer-forming clad plate for use in the semiconductor device of excellent selective etching property can be manufactured.

What is claimed is:

1. A method for manufacturing an interposer-forming clad layer for use in a semiconductor device manufactured by press-bonding an oxygen-free copper foil material and a nickel foil material at a rolling reduction of 0.1 to 3%, wherein the interposer-forming clad plate for use in the semiconductor device is formed by previously applying an activating treatment to the bonded surfaces of an oxygen free copper foil and the nickel foil or nickel plating in a vacuum vessel and then laminating an oxygen free copper foil and the nickel foil material or nickel plating and cold press-binding them at a rolling reduction of 0.1 to 3% in which the activating treatment is applied in an inert gas atmosphere at an extremely low pressure of $1 \times 10^1$ to $1 \times 10^{-2}$ Pa, using the nickel plated oxygen free copper foil material and an oxygen free copper foil material as one electrode A having a bonding surface grounded to the earth, respectively, and conducting glow discharge by applying an AC current at 1 to 50 MHz between the electrode A and another electrode B supported insulatively and applying sputter etching, with the area of the electrode exposed in plasma caused by the glow discharge being $\frac{1}{3}$ or less of electrode B.

2. A method for manufacturing an interposer-forming clad layer for use in a semiconductor device by press-bonding an oxygen-free copper foil material having nickel plating on one surface or both surfaces and other oxygen free copper foil material or an oxygen free copper foil material having nickel plating on one surface at a rolling reduction of 0.1 to 3%, wherein the interposer-forming clad plate for use in the semiconductor device is formed by previously applying an activating treatment to the bonded surfaces of an oxygen free copper foil and the nickel foil or nickel plating in a vacuum vessel and then laminating an oxygen free copper foil and the nickel foil material or nickel plating and cold press-binding them at a rolling reduction of 0.1 to 3% in which the activating treatment is applied in an inert gas atmosphere at an extremely low pressure of $1 \times 10^1$ to $1 \times 10^{-2}$ Pa, using the nickel plated oxygen free copper foil material and an oxygen free copper foil material as one electrode A having a bonding surface grounded to the earth, respectively, and conducting glow discharge by applying an AC current at 1 to 50 MHz between the electrode A and another electrode B supported insulatively and applying sputter etching, with the area of the electrode exposed in plasma caused by the glow discharge being $\frac{1}{3}$ or less of electrode B.

* * * * *